(12) United States Patent
Tsai et al.

(10) Patent No.: US 12,727,109 B2
(45) Date of Patent: Sep. 1, 2026

(54) RACK MODULE AND VIBRATION REDUCTION MECHANISM

(71) Applicants: INVENTEC (PUDONG) TECHNOLOGY CORPORATION, Shanghai (CN); INVENTEC CORPORATION, Taipei City (TW)

(72) Inventors: Hsieh-Liang Tsai, Taipei City (TW); Wen-Cheng Hu, Taipei City (TW); Chia Hung Lin, Taipei City (TW)

(73) Assignees: INVENTEC (PUDONG) TECHNOLOGY CORPORATION, Shanghai (CN); INVENTEC CORPORATION, Taipei City (TW)

( * ) Notice: Subject to any disclaimer, the term of this patent is extended or adjusted under 35 U.S.C. 154(b) by 105 days.

(21) Appl. No.: 18/977,343

(22) Filed: Dec. 11, 2024

(65) Prior Publication Data

US 2026/0075741 A1 Mar. 12, 2026

(30) Foreign Application Priority Data

Sep. 10, 2024 (CN) ........................ 202411268698.5

(51) Int. Cl.
*H05K 7/14* (2006.01)
*H05K 7/18* (2006.01)

(52) U.S. Cl.
CPC ............ *H05K 7/1489* (2013.01); *H05K 7/18* (2013.01)

(58) Field of Classification Search
CPC combination set(s) only.
See application file for complete search history.

(56) References Cited

U.S. PATENT DOCUMENTS 8,240,490 B2 * 8/2012 Malekmadani ...... A47B 96/024 211/188
9,198,321 B1 * 11/2015 Heydari .............. H05K 7/1495
11,716,827 B1 * 8/2023 Conroy .................... H05K 7/14 361/679.02
12,235,693 B2 * 2/2025 Tsorng ................ H05K 7/1489
2004/0105655 A1 * 6/2004 Ciulla ...................... H05K 7/18 211/26
2011/0149508 A1 * 6/2011 Malekmadani ...... H05K 7/1489 361/679.48
2014/0353458 A1 * 12/2014 Wu ...................... G11B 33/128 248/581
2024/0172384 A1 * 5/2024 Notohardjono ...... H05K 7/1411
2026/0075741 A1 * 3/2026 Tsai .................... H05K 7/1489

* cited by examiner

*Primary Examiner* — Lisa Lea-Edmonds
(74) *Attorney, Agent, or Firm* — Maschoff Brennan

(57) ABSTRACT

A rack module includes a rack, a plurality of electronic devices and at least one vibration reduction mechanism. The electronic devices are disposed in the rack. The at least one vibration reduction mechanism is disposed in the rack and includes a casing and a weight distribution assembly disposed in the casing.

10 Claims, 5 Drawing Sheets

30
321
32
322
G
P
C
N
3111
311
312
312
31

RACK MODULE AND VIBRATION REDUCTION MECHANISM

CROSS-REFERENCE TO RELATED APPLICATIONS

This non-provisional application claims priority under 35 U.S.C. § 119(a) on Patent Application No(s). 202411268698.5 filed in China, on Sep. 10, 2024, the entire contents of which are hereby incorporated by reference.

BACKGROUND OF THE INVENTION

Technical Field of the Invention

The invention relates to a rack module and a vibration reduction mechanism.

Description of the Related Art

In general, when manufacturers ship a rack module, they would arrange foam materials on a pallet carrying the rack module to prevent vibration from damaging electronic devices (such as servers) in the rack module during transportation. With the development of science and technology, the performances of the electronic devices in the rack module are further improved, and the demand for vibration reduction is getting more important. Therefore, the conventional method of arranging the foam materials on the pallet is no longer sufficient to meet the demand for vibration reduction. As a result, how to address the aforementioned issue is one of the topics in this field.

SUMMARY OF THE INVENTION

The invention provides a rack module and a vibration reduction mechanism which can reduce vibration transmitted to the electronic devices in the rack module.

One embodiment of the invention provides a rack module. The rack module includes a rack, a plurality of electronic devices and at least one vibration reduction mechanism. The electronic devices are disposed in the rack. The vibration reduction mechanism is disposed in the rack and includes a casing and a weight distribution assembly disposed in the casing.

Another embodiment of the invention provides a vibration reduction mechanism. The vibration reduction mechanism is configured to be disposed in a rack. The vibration reduction mechanism includes a casing and a weight distribution assembly disposed in the casing.

According to the rack module and the vibration reduction mechanism as discussed in the above embodiments, the vibration reduction mechanism is disposed in the rack and includes the casing and the weight distribution assembly disposed in the casing, which can reduce the vibration transmitted to the electronic devices in the rack module during the transportation of the rack module, thereby ensuring the electronic devices in the rack module to operate normally after the rack module is transported to a designated spot.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
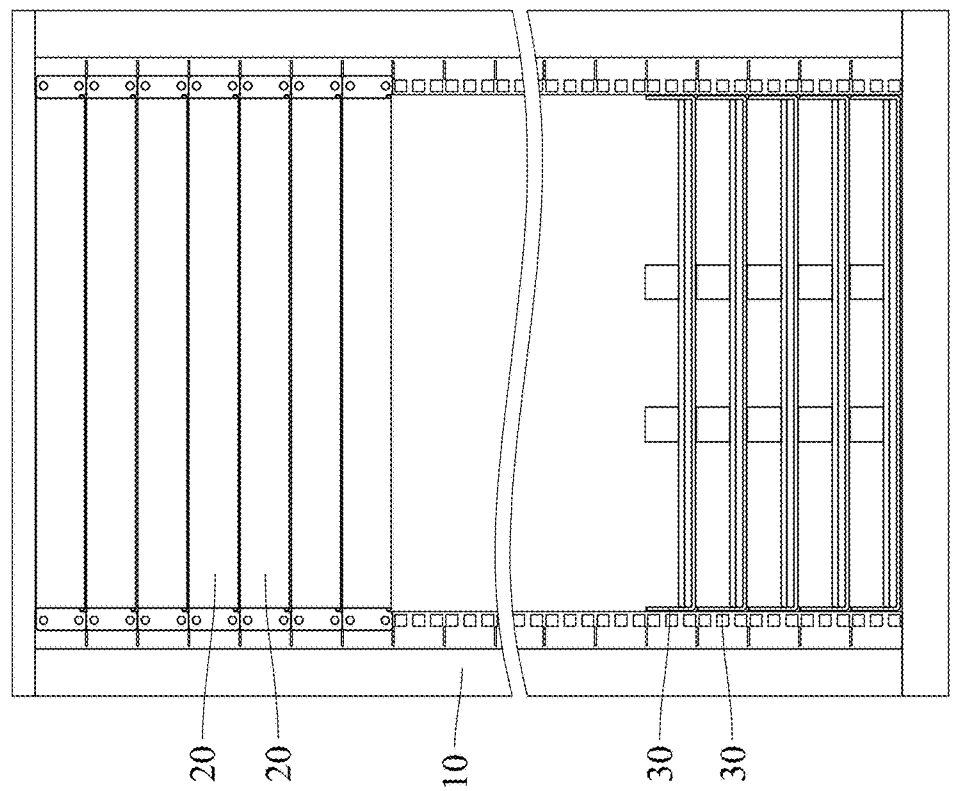
FIG. 1 is a partial schematic view of a rack module according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Referring to FIG. 1, FIG. 1 is a schematic view of a rack module according to one embodiment of the invention.

In this embodiment, the rack module 1 includes a rack 10, a plurality of electronic devices 20 and at least one vibration reduction mechanism 30. The electronic devices 20 are, for example, servers, and the electronic devices 20 are mounted in the rack 10 via rails (not shown). The vibration reduction mechanism 30 is disposed in the rack 10, and the following paragraphs will specifically introduce the vibration reduction mechanism 30.

Figure 2:
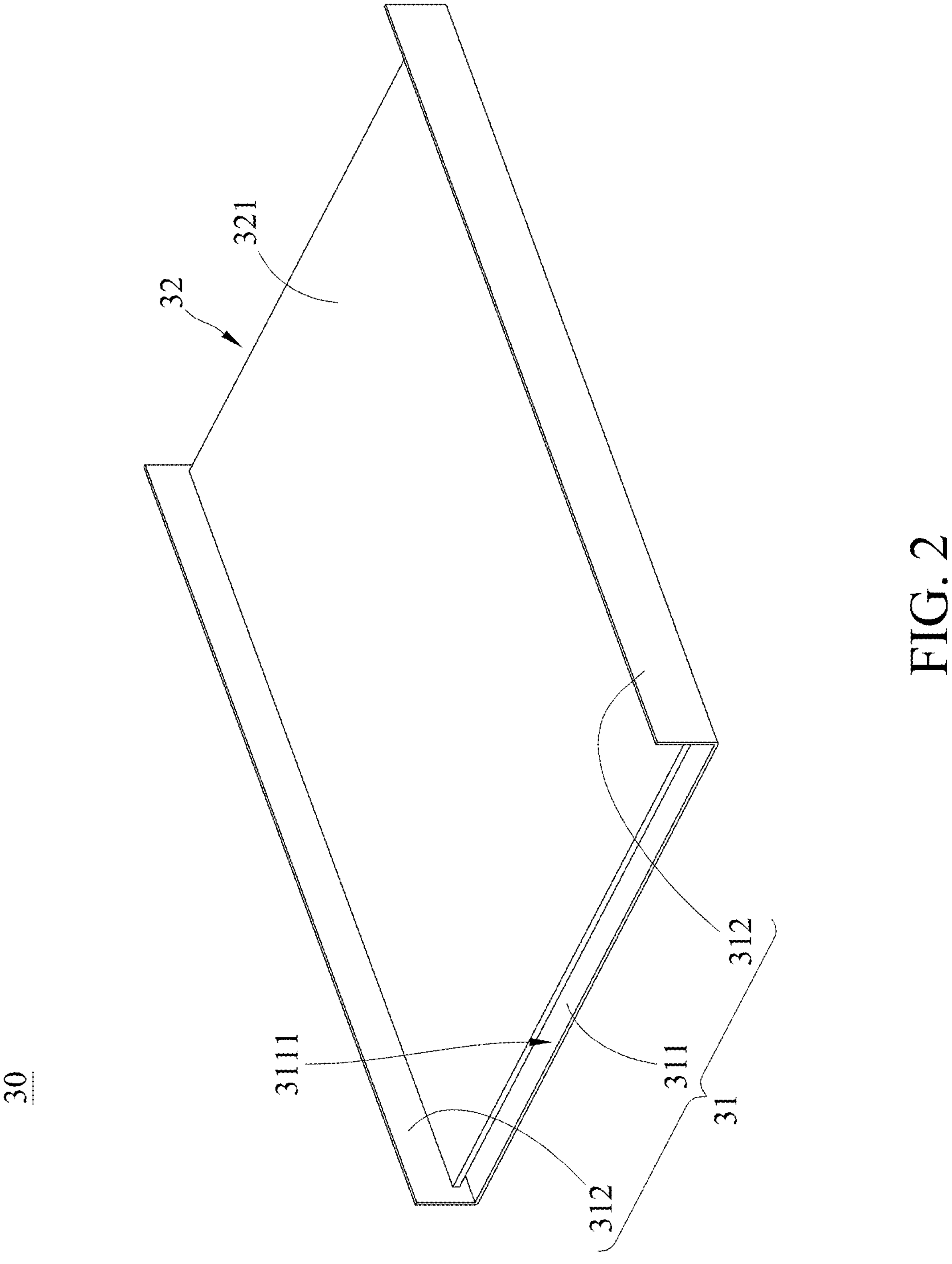
FIG. 2 is a perspective view of a vibration reduction mechanism in FIG. 1 when the vibration reduction mechanism is in a first state.
Figure 3:
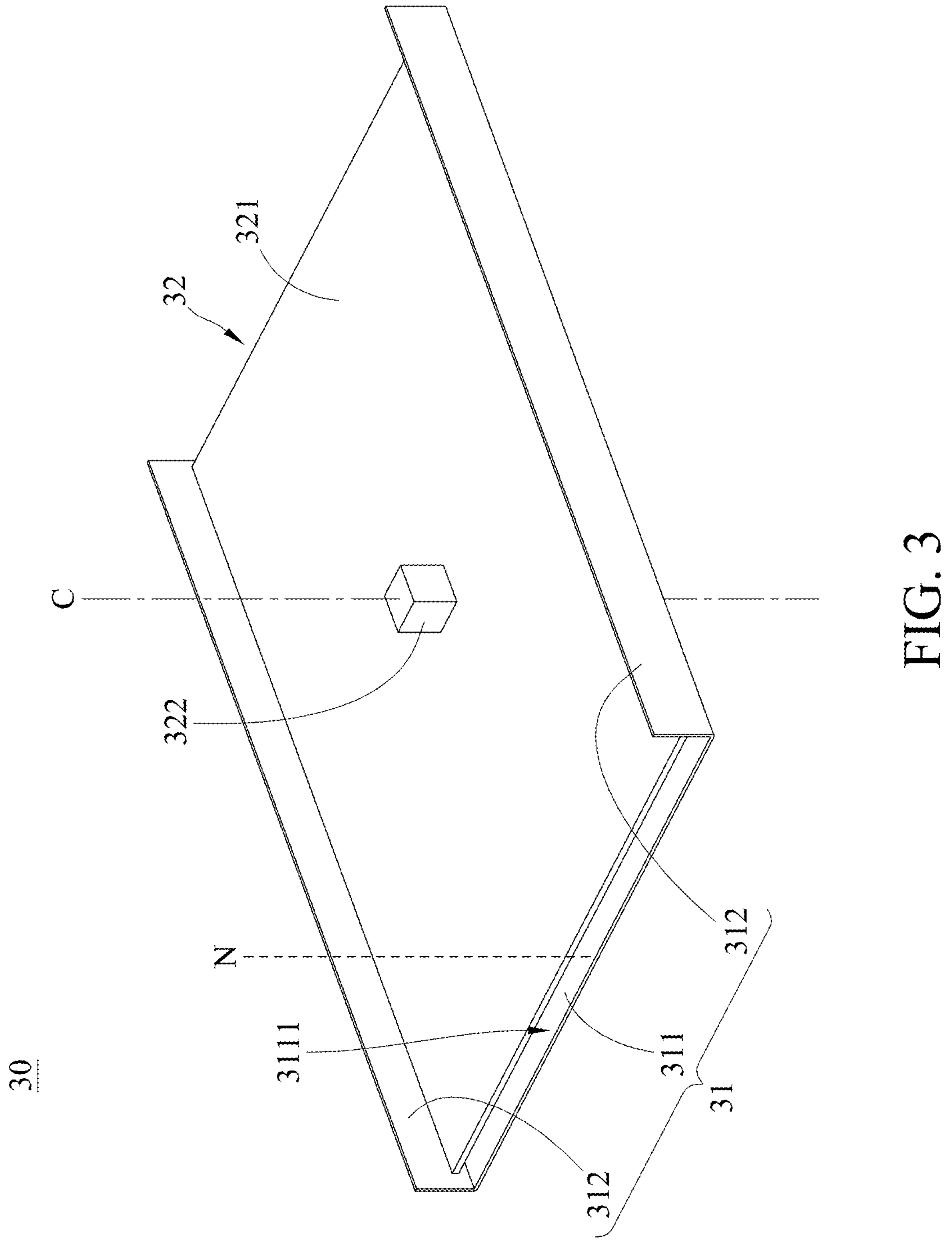
FIG. 3 is a perspective view of the vibration reduction mechanism in FIG. 1 when the vibration reduction mechanism is in a second state.
Figure 4:
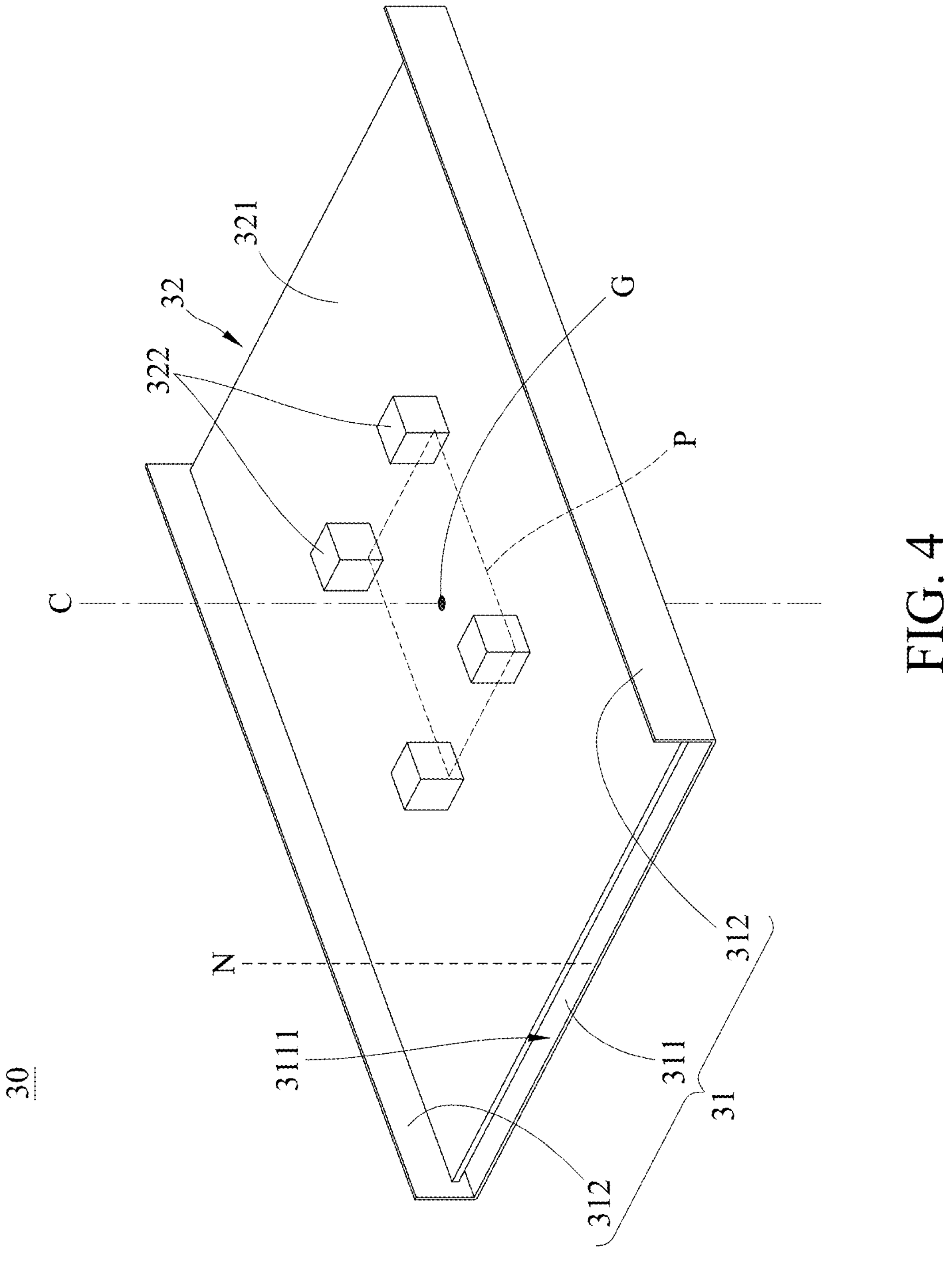
FIG. 4 is a perspective view of the vibration reduction mechanism in FIG. 1 when the vibration reduction mechanism is in a third state.

Referring to FIGS. 2 to 4, FIG. 2 is a perspective view of a vibration reduction mechanism in FIG. 1 when the vibration reduction mechanism is in a first state, FIG. 3 is a perspective view of the vibration reduction mechanism in FIG. 1 when the vibration reduction mechanism is in a second state, and FIG. 4 is a perspective view of the vibration reduction mechanism in FIG. 1 when the vibration reduction mechanism is in a third state. In this embodiment, the vibration reduction mechanism 30 is, for example, selectively in a first state, a second state or a third state.

The vibration reduction mechanism 30 in the first state will be firstly introduced. As shown in FIG. 2, the vibration reduction mechanism 30 includes a casing 31 and a weight distribution assembly 32. The weight distribution assembly 32 includes a weight distribution plate 321. The casing 31 is, for example, similar to a casing of the server, such that the casing 31 can also be mounted in the rack 10 via the rail. The casing 31 includes a bottom plate 311 and two side plates 312, and the two side plates 312 are respectively connected to two opposite sides of the bottom plate 311. The bottom plate 311 of the casing 31 comprises a support surface 3111. The weight distribution plate 321 is, for example but not limited to, a flat plate. The weight distribution plate 321 is disposed in the casing 31 and located above the support surface 3111 of the casing 31; that is, the support surface 3111 of the casing 31 faces the weight distribution plate 321.

Then, the vibration reduction mechanism 30 in the second state will be introduced. As shown in FIG. 3, the weight distribution assembly 32 includes not only the weight distribution plate 321 but also a weight distribution block 322. This weight distribution block 322 is disposed on a surface of the weight distribution plate 321 facing away from the support surface 3111, for example, via a screw or adhesive. A central line C of the bottom plate 311 of the casing 31 is parallel to a normal line N of the support surface 3111 and passes through the weight distribution block 322.

Then, the vibration reduction mechanism 30 in the third state will be introduced. As shown in FIG. 4, the weight distribution assembly 32 includes a plurality of weight distribution blocks 322. The weight distribution blocks 322 are, for example, located at corners of a polygon P, respectively, and the central line C of the casing 31 passes through a center of gravity of the polygon P. For example, the weight distribution assembly 32 includes four weight distribution blocks 322, and the weight distribution blocks 322 are respectively located at corners of a quadrilateral (e.g., a rectangle), and the central line C of the casing 31 passes through the center G of gravity of the quadrilateral.

Thicknesses of plates (e.g., the bottom plate 311 and the side plates 312) of the aforementioned casing 31 may fall within a range from 1 mm to 1.5 mm, and a thickness of the weight distribution plate 321 may fall within a range from 1 mm to 1.5 mm. Furthermore, the thicknesses of the plates of the casing 31 may fall within a range from 1 mm to 1.2 mm, and the thickness of the weight distribution plate 321 may fall within a range from 1 mm to 1.2 mm. On the other hand, the weight of the weight distribution block 322 is, for example, 1.5 kg.

As shown in Table 1, after a finite element simulation is performed, the vibration reduction mechanism 30 in different states and parameters can provide a significant vibration reduction effect to a vibration in a specific frequency range.

TABLE 1

| State of vibration reduction mechanism | Thicknesses of plates of casing | Thickness of weight distribution plate | Total weight of weight distribution block(s) | frequency range of vibration that the vibration reduction effect can be provided |
|---|---|---|---|---|
| First state | 1~1.5 mm | 1~1.5 mm | 0 kg | 21~40 Hz |
| Second state | 1~1.2 mm | 1~1.2 mm | 1.5 kg | 19~23 Hz |
| Third state | 1~1.2 mm | 1~1.2 mm | 6 kg | 15.5~19 Hz |

Then, the following descriptions will introduce which state of the vibration reduction mechanism 30 should be selected. Firstly, a resonance frequency range of the rack 10 and the electronic devices 20 in the rack 10 is obtained via an experiment for determining the frequency range of the vibration desired to be reduced. Assuming that the frequency range of the vibration desired to be reduced is from 15 Hz to 20 Hz, the vibration reduction mechanism 30 in the third state can be selected and placed into the rack 10, and then a random vibration simulation can be performed for verifying whether the vibration reduction mechanism 30 achieves the vibration reduction effect. For example, referring to FIG. 5 and Table 2, FIG. 5 is a curve chart showing the relationship between acceleration and frequency of the rack module in FIG. 1 carrying different quantities of vibration reduction mechanism, and Table 2 lists the vibration simulation results in different quantities of the vibration reduction mechanism.

TABLE 2

| | Without vibration reduction mechanism | One vibration reduction mechanism | three vibration reduction mechanisms | twelve vibration reduction mechanisms |
|---|---|---|---|---|
| Peak value of acceleration ($g^2$/Hz) | 2.23 | 1.25 | 0.5 | 0.223 |
| Improvement of Peak value of acceleration | — | 43% | 77% | 90% |
| Grms value | 1.37 | 1.14 | 0.9 | 0.71 |
| Improvement of Grms value | — | 16% | 34% | 48% |

Figure 5:
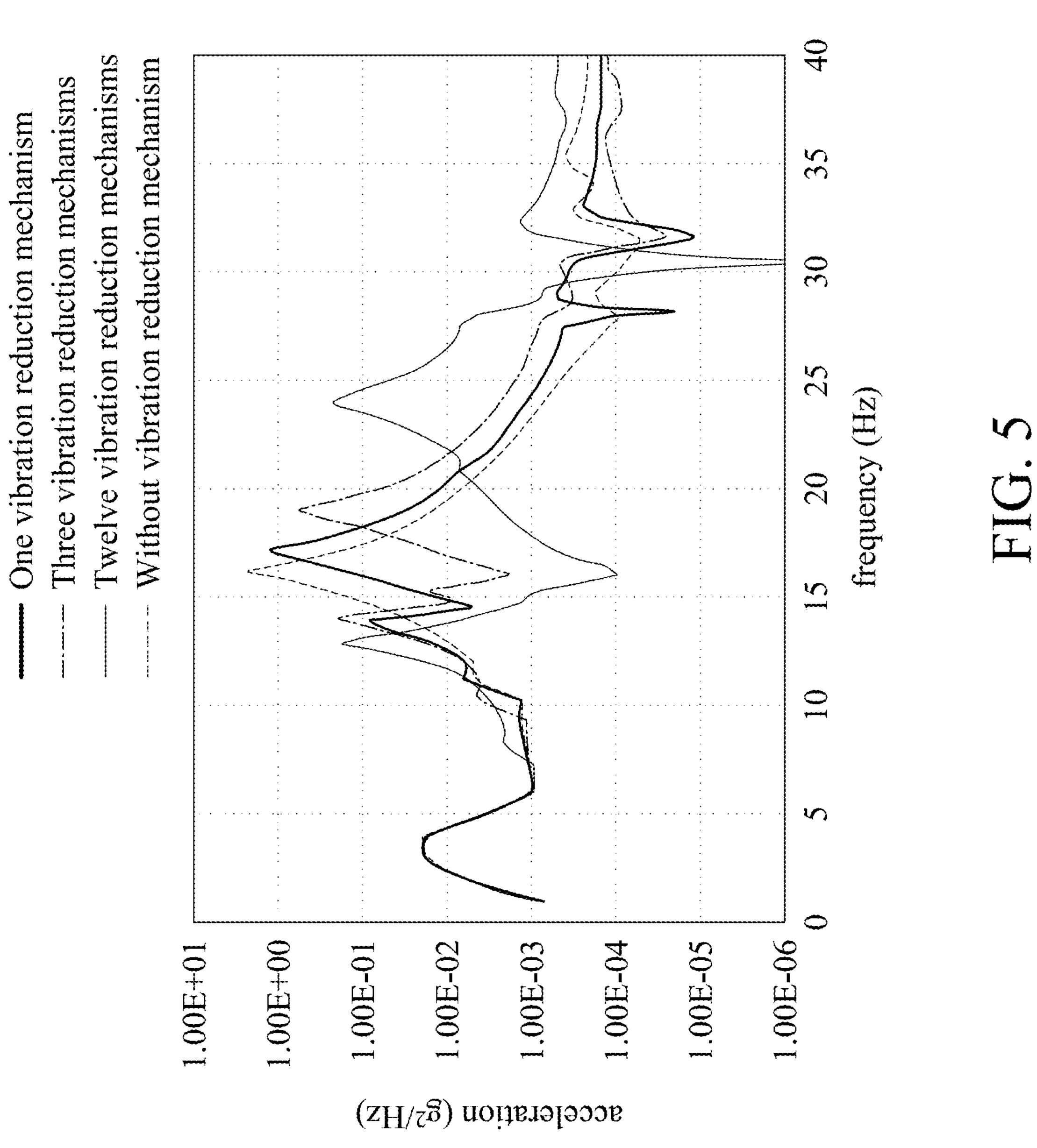
FIG. 5 is a curve chart showing the relationship between acceleration and frequency of the rack module in FIG. 1 carrying different quantities of vibration reduction mechanisms.

From FIG. 5 and Table 2, it can be understood that the vibration reduction mechanism 30 can reduce vibration, and the more quantity of the vibration reduction mechanism 30 is, the better vibration reduction effect is; that is, the quantity of the vibration reduction mechanism 30 and the vibration reduction effect are in positive correlation. When there are twelve vibration reduction mechanisms 30 in the rack module 1, the vibration can be reduced about 50%.

As a result, the vibration reduction mechanism 30 is disposed in the rack 10 and includes the casing 31 and the weight distribution assembly 32 disposed in the casing 31, which can reduce the vibration transmitted to the electronic devices 20 in the rack module 1 during the transportation of the rack module 1, thereby ensuring the electronic devices 20 in the rack module 1 to operate normally after the rack module 1 is transported to a designated spot.

In addition, the central line C of the bottom plate 311 of the casing 31 of the vibration reduction mechanism 30 in the second state passes through the weight distribution block 322; the weight distribution blocks 322 of the vibration reduction mechanism 30 in the third state are respectively located at the corners of the polygon P, and the central line C of the casing 31 passes through the center C of gravity of this polygon P, which can further improve the vibration reduction effect provided by the vibration reduction mechanism 30.

Note that when the vibration reduction mechanism 30 is in the second or third state, the position(s) of the weight distribution block(s) 322 on the weight distribution plate 321 is not restricted in the invention and may be modified according to actual requirements.

In addition, the vibration reduction mechanism 30 is not restricted to merely having the first state, the second state and the third state. In some other embodiments, the quantities of the weight distribution plate and the weight distribution block of the vibration reduction mechanism and the position of the weight distribution block on the weight distribution plate may be modified according to actual requirement for enabling the vibration reduction mechanism having more states to achieve the desired vibration reduction effect.

In this invention, the server can be used for artificial intelligence (AI) computing, edge computing, and can also be used as a 5G server, a cloud server or a server for vehicle-to-everything.

According to the rack module and the vibration reduction mechanism as discussed in the above embodiment, the vibration reduction mechanism is disposed in the rack and includes the casing and the weight distribution assembly disposed in the casing, which can reduce the vibration transmitted to the electronic devices in the rack module during the transportation of the rack module, thereby ensuring the electronic devices in the rack module to operate normally after the rack module is transported to a designated spot.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A rack module, comprising:

a rack;

a plurality of electronic devices, disposed in the rack; and at least one vibration reduction mechanism, disposed in the rack and comprising a casing and a weight distribution assembly disposed in the casing.

2. The rack module according to claim 1, wherein the weight distribution assembly comprises a weight distribution plate.

3. The rack module according to claim 2, wherein the weight distribution assembly further comprise at least one weight distribution block disposed on the weight distribution plate.

4. The rack module according to claim 3, wherein the casing comprises a support surface, the support surface faces the weight distribution plate, a central line of the casing is parallel to a normal line of the support surface, and the central line of the casing pass through the at least one weight distribution block.

5. The rack module according to claim 3, wherein the at least one weight distribution block comprises a plurality of weight distribution blocks.

6. The rack module according to claim 5, wherein the casing comprises a support surface, the support surface faces the weight distribution plate, a central line of the casing is parallel to a normal line of the support surface, the plurality of weight distribution blocks are respective located at corners of a polygon, and the central line of the casing passes through a center of gravity of the polygon.

7. The rack module according to claim 3, wherein thicknesses of plates of the casing fall within a range from 1 mm to 1.5 mm, a thickness of the weight distribution plate falls within a range from 1 mm to 1.5 mm, and a weight of the at least one weight distribution block is 1.5 kg.

8. The rack module according to claim 7, wherein the thicknesses of the plates of the casing fall within a range from 1 mm to 1.2 mm, and the thickness of the weight distribution plate falls within a range from 1 mm to 1.2 mm.

9. A vibration reduction mechanism, configured to be disposed in a rack, the vibration reduction mechanism comprising:

a casing; and a weight distribution assembly, disposed in the casing.

10. The vibration reduction mechanism according to claim 9, wherein the weight distribution assembly comprises a weight distribution plate and at least one weight distribution block disposed on the weight distribution plate.

* * * * *